US009509316B2

(12) United States Patent
Pinoncely

(10) Patent No.: US 9,509,316 B2
(45) Date of Patent: Nov. 29, 2016

(54) GRAY COUNTER AND ANALOGUE-DIGITAL CONVERTER USING SUCH A COUNTER

(71) Applicant: PYXALIS, Moirans (FR)

(72) Inventor: Pierre-Adrien Pinoncely, Miribel Lanchatre (FR)

(73) Assignee: Pyxalis, Moirans (FR)

( * ) Notice: Subject to any disclaimer, the term of this patent is extended or adjusted under 35 U.S.C. 154(b) by 0 days.

(21) Appl. No.: 14/933,915

(22) Filed: Nov. 5, 2015

(65) Prior Publication Data
US 2016/0134290 A1 May 12, 2016

(30) Foreign Application Priority Data

Nov. 7, 2014 (FR) ...................... 14 60765

(51) Int. Cl.
H03M 1/34 (2006.01)
H03K 23/00 (2006.01)
H03M 7/16 (2006.01)
H03K 4/06 (2006.01)
H03M 1/36 (2006.01)

(52) U.S. Cl.
CPC ............ *H03K 23/005* (2013.01); *H03K 4/06* (2013.01); *H03M 1/36* (2013.01); *H03M 7/16* (2013.01)

(58) Field of Classification Search
CPC ................... H03M 1/36; H03K 4/06
USPC ............ 341/155, 158, 161; 377/34, 20, 104
See application file for complete search history.

(56) References Cited

U.S. PATENT DOCUMENTS

| 2,632,058 | A | | 3/1953 | Gray |
| 3,984,815 | A | * | 10/1976 | Drexler ................... G04F 10/00 377/20 |
| 5,754,614 | A | | 5/1998 | Wingen |
| 6,795,520 | B2 | * | 9/2004 | Van Der Valk ...... H03K 23/665 377/104 |
| 7,991,104 | B1 | * | 8/2011 | Dahan ................ H03K 19/0016 377/34 |
| 2005/0129167 | A1 | * | 6/2005 | Heimbigner ......... H03K 23/005 377/34 |
| 2010/0321547 | A1 | | 12/2010 | Morikawa et al. |

FOREIGN PATENT DOCUMENTS

WO 01/33716 A1 5/2001

OTHER PUBLICATIONS

J. Kathuria et al. "A Review of Clock Gating Techniques," MIT International Journal of Electronics and Communication Engineering, vol. 1, No. 2, pp. 106-114, 2011.

* cited by examiner

Primary Examiner — Peguy Jean Pierre

(57) ABSTRACT

An N-bit Gray counter, with N an integer greater than 1, comprises a string of N logic cells connected in cascade, wherein each logic cell comprises an input port for a succession of clock pulses, a circuit for generating a Gray count bit having an output port for the Gray count bit and a circuit for generating a clock signal having a clock output port linked to the input port of the following logic cell. An analog-digital converter of ramp type using such a Gray counter is also provided.

12 Claims, 5 Drawing Sheets

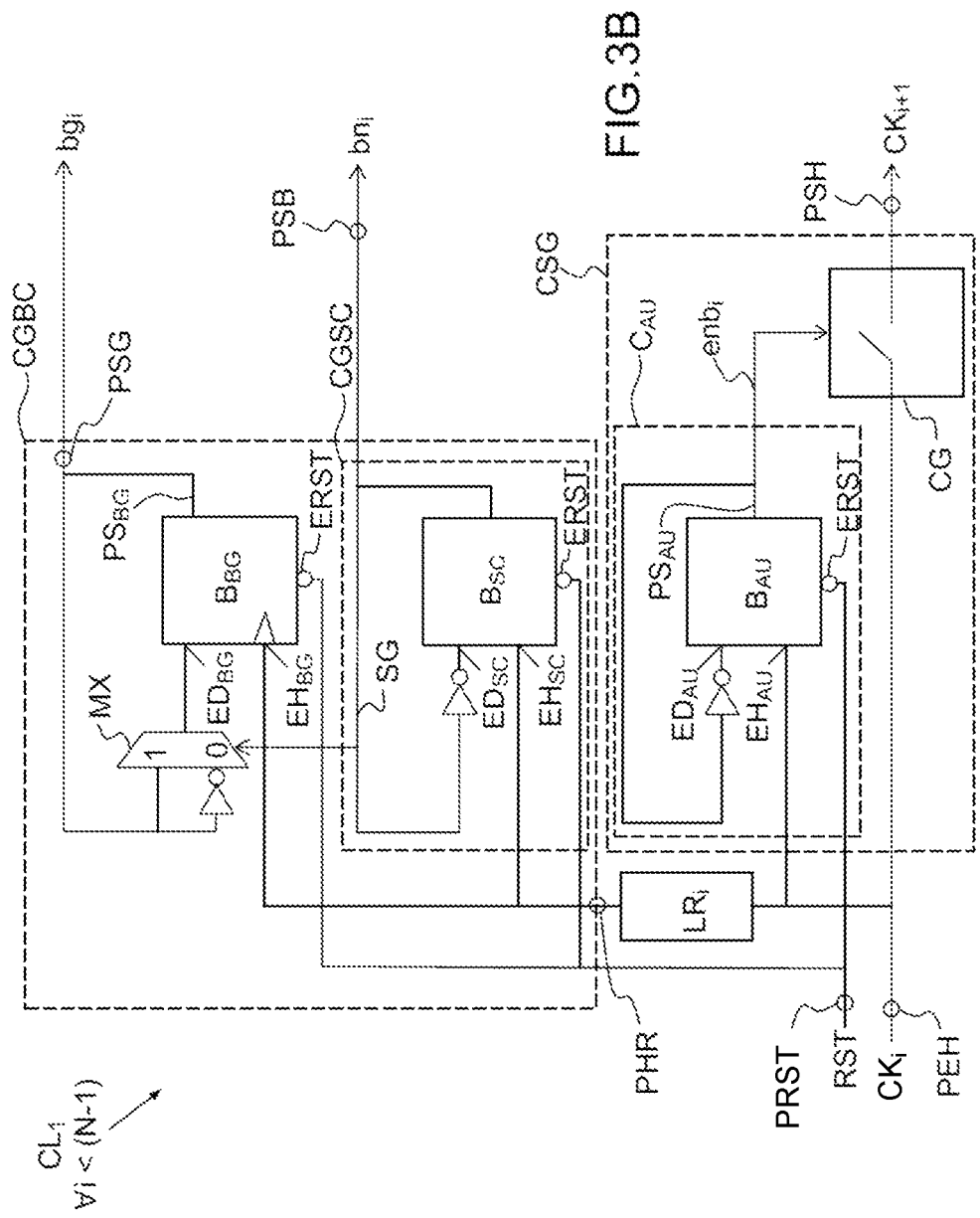

GRAY COUNTER AND ANALOGUE-DIGITAL COUNTER USING SUCH A COUNTER

CROSS-REFERENCE TO RELATED APPLICATIONS

This application claims priority to foreign French patent application No. FR 1460765, filed on Nov. 7, 2014, the disclosure of which is incorporated by reference in its entirety.

FIELD OF THE INVENTION

The invention pertains to a Gray counter, as well as to a ramp analogue-digital converter using such a counter.

A Gray counter is a digital circuit which performs a counting of the pulses present at its input according to a Gray code.

BACKGROUND OF THE INVENTION

The Gray code is a binary code, described notably in document U.S. Pat. No. 2,632,058, which exhibits the advantage of requiring only the modification of a single bit when a number is incremented or decremented by one unit. This is not the case for the natural binary code in which, for example, passing from "3" (011) to "4" (100) requires the simultaneous changing of three bits.

In a natural binary counter, the fact of having to modify several bits at one and the same time when incrementing or decrementing can lead to the appearance of undesirable transient states, due to the fact that the lag in updating the various bits is different. Thus, when passing from "011" (3) to "100" (4), it is possible that the right bit may be updated first, then the central bit and finally the left bit. In this case, the counter passes briefly through the intermediate states "010" (2) and "000" (0). A reading of the counter performed when the latter is in such an intermediate state may therefore produce a considerable error. This leads to natural binary counters being used only in systems where it is possible to ensure synchronous reading, and to the counting rate being limited. Gray counters do not exhibit such a drawback: as a single bit changes during an increment or decrement, there is no intermediate state; even if the counter is read before its update is completed, the error made does not exceed one unit.

The table hereinbelow makes it possible to compare Gray and binary natural codes for the decimal numbers from 0 to 7:

| Decimal | Gray | Natural binary |
|---------|------|----------------|
| 0 | 000 | 000 |
| 1 | 001 | 001 |
| 2 | 011 | 010 |
| 3 | 010 | 011 |
| 4 | 110 | 100 |
| 5 | 111 | 101 |
| 6 | 101 | 110 |
| 7 | 100 | 111 |

It may be noted that, to increment a number in Gray code, it suffices to invert the rightmost possible bit which leads to a code word not used in precedence. Thus to pass from 0 (000) to 1 (001) the rightmost bit is inverted; then, to pass from 1 (001) to 2 (011) the second bit from the right is inverted (since if the rightmost bit were inverted it would yield 000, already used) and so on and so forth.

FIGS. 1A and 1B illustrate the diagram of a Gray counter known from the prior art. As shown by FIG. 1A, such a counter is composed of a plurality of cells $C_0, C_1 \ldots C_{N-1}$ connected in cascade, each generating a Gray bit $bg_0$, $bg_1 \ldots bg_{N-1}$ as well as an intermediate bit $Z_0, Z_1 \ldots Z_{N-1}$. Each cell receives as input the Gray bit and the intermediate bit which are generated by the previous cell (but the first cell receives as input two "1"s; the second cell receives as input a "1" instead of the intermediate bit $Z_0$ generated by the first cell $C_0$ and the last cell receives as input a "1" instead of the next to last Gray bit), a clock signal CK common to all the cells and a so-called "parity" bit BP which changes at each clock cycle and which equals "0" when the parity of the word $bg_0, bg_1 \ldots bg_{N-1}$ equals "0" and which equals "1" in the converse case (the bit of BPI is inverted at the input of the first cell). FIG. 1B illustrates the logic diagram of a cell C(i), where the reference $B_T$ indicates a flip-flop of "T" type.

In the circuit of FIGS. 1A and 1B, the Gray bit $bg_i$, generated by the cell $C_i$, with i>0, depends on the value of the Gray bit $bg_{i-1}$ and the intermediate bit $Z_{i-1}$ generated by the previous cell, $C_{i-1}$. It may be realized that the depth of the "logic cone" at the input of the cell $C_i$ depends on its order, i. It is known that the clock frequency of a digital circuit is limited by its logic cone of maximum depth; consequently, the higher the number of cells of which a conventional Gray counter is composed, the less fast it is.

Gray counters are used, inter alia, for the production of ramp analogue-digital converters, a basic diagram of which is shown in FIG. 2. A ramp converter comprises a voltage comparator CT receiving at a first input an analogue voltage signal Vs to be digitized and at a second input a voltage ramp $V_R(t)=V_0 \cdot t/T$ of duration T and with $V_0 > V_s$, generated by a circuit GRT. The converter also comprises a binary—preferably Gray—counter CBG, exhibiting a first input for a triggering signal and a second input for a stopping signal, as well as a counting output ($bg_0 \ldots bg_{N-1}$). A triggering signal D is provided both to the counter and to the ramp generator at intervals T; thus the count starts at the commencement of the ramp. The output signal of the comparator, $S_{ART}$ is provided to the second input of the counter in the guise of stopping signal; thus the count is stopped when the ramp $V_R(t)$ exceeds the analogue input signal of the converter (in certain applications, the stopping of the count can be achieved by transferring the output of the counter to a memory element, without stopping the counter; this makes it possible to use a counter common to several converters, each having its own comparator and a common ramp generator). It is readily understood that the value displayed by the counter when the count is stopped is proportional to the value of $V_s$. The higher the number of bits of the Gray counter, the higher the resolution of the converter. In accordance with what was explained above, it is understood that it is necessary to accept a compromise between the pace of the converter—limited by that of the Gray counter—and its resolution.

The invention is aimed at surmounting the aforementioned drawbacks of the prior art, and more particularly at affording a Gray counter whose clock frequency—and therefore whose counting speed—does not depend on the number of bits. Such a counter is particularly appropriate for use in a ramp analogue-digital converter, although other applications are also conceivable.

SUMMARY OF THE INVENTION

In accordance with the invention such an aim is achieved by virtue of a novel architecture of Gray counter comprising a string of logic cells coupled together solely by way of a clock signal.

Thus, a subject of the invention is an N-bit Gray counter, with N an integer greater than 1, comprising a string of N logic cells connected in cascade, in which each said logic cell comprises an input port for a succession of clock pulses and a circuit for generating a Gray count bit having an output port for the said Gray count bit, characterized in that each said logic cell, except at most the last logic cell, of the said string also comprises a circuit for generating a clock signal having a clock output port linked to the input port of the following logic cell, and in that:

each said circuit for generating a clock signal is adapted for authorizing the passage to the said clock output port of one clock pulse out of two present at the said input port and for prohibiting the passage of the following clock pulse;

the circuit for generating a Gray count bit for each said logic cell, with the exception of the last logic cell of the said string, is adapted for inverting the value of the count bit present at its output port each time that the said circuit for generating a clock signal of the corresponding logic cell prohibits the passage of a said clock pulse, and for maintaining the said value unchanged in the converse case; and the circuit for generating a Gray count bit for the said last logic cell of the said string is adapted for inverting the value of the count bit present at its output port each time that a clock pulse is present at the input port of the said last logic cell.

According to various embodiments of such a Gray counter:

The circuit for generating a Gray count bit for each said logic cell, except at most the last logic cell, of the said string, may also comprise a clock signal input linked to the input port of the corresponding logic cell by way of a delay line adapted for introducing a delay which decreases according to the order of the said logic cell in the said string.

Each said circuit for generating a clock signal may comprise: a switch configured to authorize or otherwise the passage of clock pulses from the said input port to the said clock output port, and an authorization circuit configured to generate a signal for driving the said switch authorizing the passage of one said clock pulse out of two and prohibiting the passage of the following clock pulse.

More particularly, the said authorization circuit may comprise a flip-flop having a data input port, a clock input port linked to the clock input port of the logic cell and an output port, the said data input port being connected so as to receive the complement of the bit present on the said output port.

The said circuit for generating a Gray count bit for each said logic cell, with the exception of the last logic cell of the said string, may comprise: a multiplexer with two inputs and an output, and connected to receive on a first input the Gray count bit for the corresponding logic cell and on a second input its complement, and configured to transfer to its output the bit present on its first input when the circuit for generating a clock signal of the said corresponding logic cell authorizes the passage of a said clock pulse, and the bit present on its second input in the converse case; and a flip-flop having a data input port, a clock input port linked to the input port of the logic cell and an output port linked to the output port for the Gray count bit for the said cell, the said data input port being linked to the output of the said multiplexer.

More particularly, the said circuit for generating a Gray count bit for each said logic cell, with the exception of the last logic cell of the said string, may also comprise a circuit for generating a control signal for the said multiplexer comprising a flip-flop having a data input port, a clock input port linked to the input port of the logic cell and an output port, the said data input port being connected so as to receive the complement of the bit present on the said output port and the said output port being connected to a control input of the said multiplexer.

More particularly still, the said circuit for generating a Gray count bit for each said logic cell may also comprise an output port called natural binary counting output port, linked to the output port of the said circuit for generating a control signal for the said multiplexer.

The said circuit for generating a Gray count bit for the said last logic cell of the said string may comprise a flip-flop having a data input port, a clock input port linked to the input port of the said logic cell and an output port linked to the output port for the Gray count bit for the said cell, the said data input port being linked so as to receive the complement of the bit present on the said output port.

The said or each said flip-flop of each said logic cell may comprise a reinitialization input, all the said reinitialization inputs being linked together so as to receive a common reinitialization signal.

Another subject of the invention is an analogue-digital converter of ramp type comprising: a generator of a voltage ramp; a voltage comparator connected so as to receive at a first input the said voltage ramp and at a second input an analogue voltage signal to be converted, and adapted for generating a stopping signal when the voltage level at its first input exceeds that at its second input and a binary counter configured to start a count at the commencement of the generation of the said ramp and stop it upon the generation of the said stopping signal, characterized in that the said binary counter is a Gray counter such as mentioned hereinabove.

BRIEF DESCRIPTION OF THE DRAWINGS

Other characteristics, details and advantages of the invention will emerge on reading the description given with reference to the appended drawings given by way of example and which represent, respectively:

FIGS. 3A, 3B and 3C, the logic diagram of a Gray counter according to an embodiment of the invention.

DETAILED DESCRIPTION

Figure 3A:
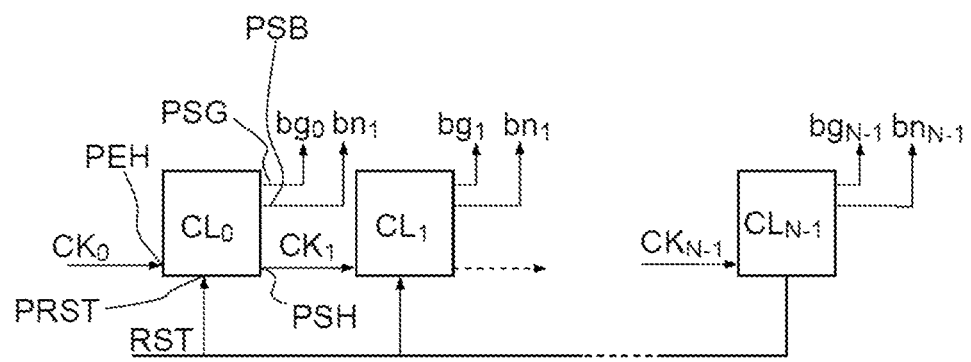
Figure 4:
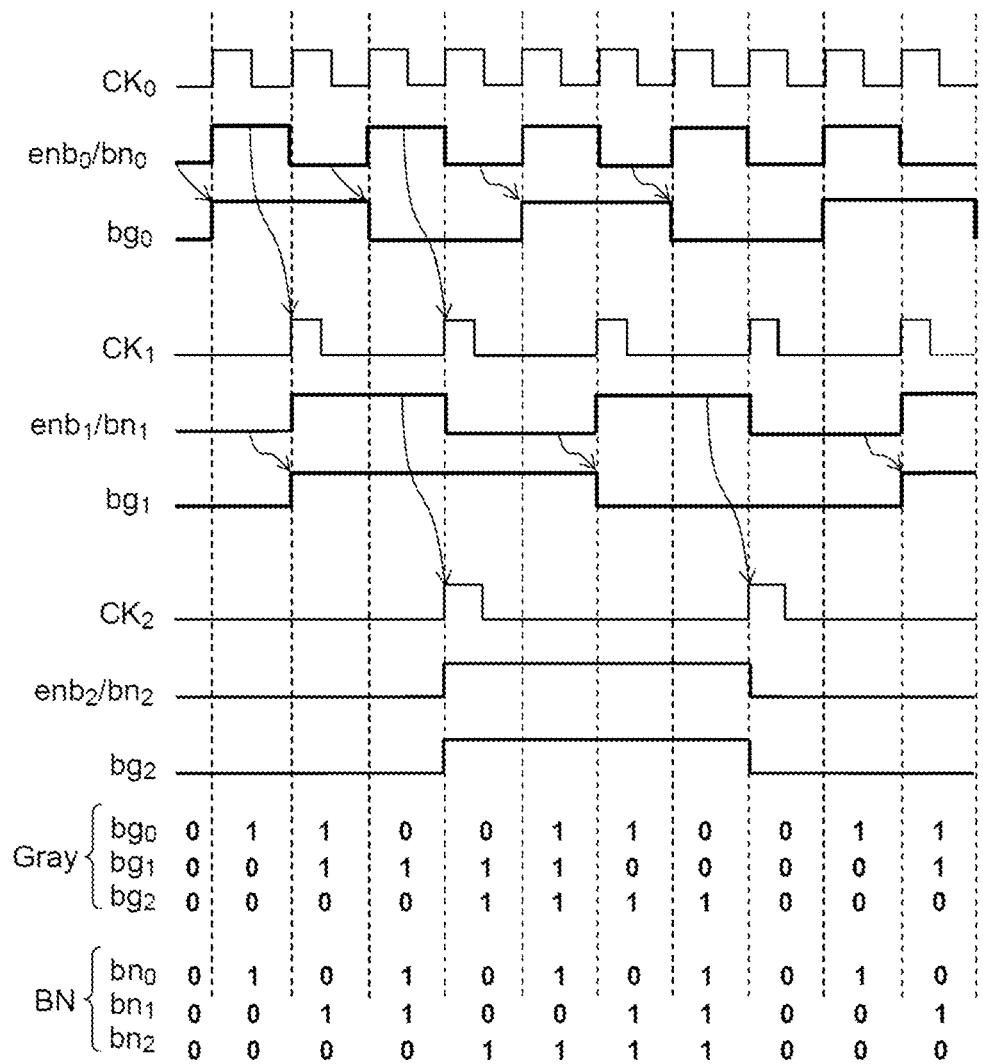
FIG. 4, a timing diagram illustrating the operation of a Gray counter according to an embodiment of the invention.

FIG. 3A shows that a Gray counter according to the invention takes the form of a string of N>1 logic cells $CL_0$-$CL_{N-1}$ each having an input port PEH for an input clock signal ($CK_i$ for the cell $CL_i$), an output port PSH for an output clock signal ($CK_{i+1}$ for the cell $CL_i$) and an output port PSG for a Gray count bit ($bg_i$ for the cell $CL_i$). The last cell of the string may not comprise any output port for the clock signal. Each cell may also comprise an output port PSB for a "natural" binary count bit ($bn_i$ for the cell $CL_i$) which, as will be explained further on, with the aid of FIGS. 3B and 4, is generated as a "by-product" of the Gray counting process implemented for each cell. Advantageously, each cell also comprises an input port PRST for a reset-to-zero signal, typically common to all the cells.

The logic cells of the counter of FIG. 3A are strung together solely by way of the clock signal. Indeed, the output clock signal of each logic cell (except obviously the last) is provided to the following cell in the guise of input clock signal. As will be explained further on, with the aid of FIGS. 3B and 4, each logic cell provides at its output port PSH a clock signal exhibiting a frequency equal to half that of the clock signal present at its input port PEH. Advantageously, this frequency division is done while allowing only one clock pulse out of two to pass through the cell, and by leaving the width of these pulses unchanged. Thus, the duty cycle of the clock signal—typically equal to 50% at the input of the counter (signal $CK_0$)—decreases as one advances along the string of cells. It will be noted that this exhibits the advantage of reducing the power consumption.

Figure 1A:
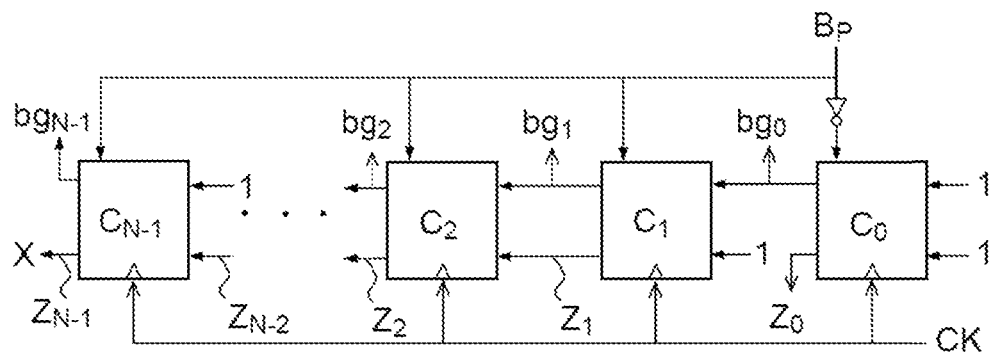
FIGS. 1A and 1B, described above, a Gray counter known from the prior art.
Figure 1B:
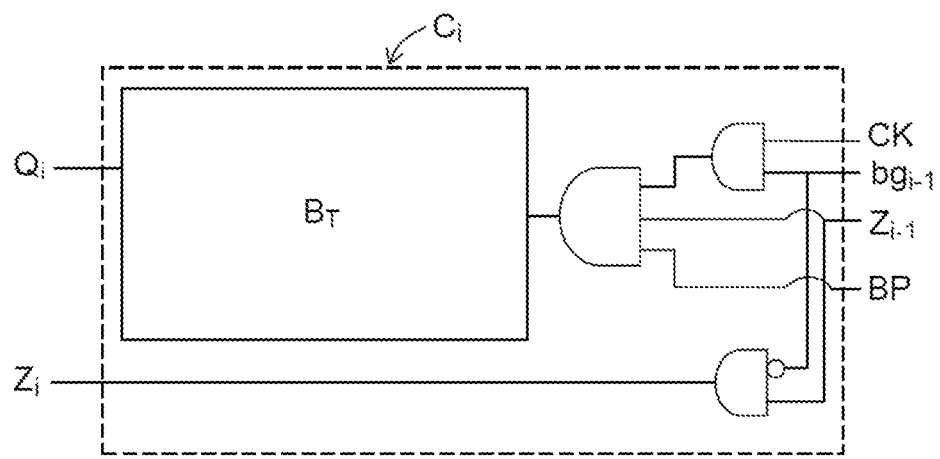

The fact that the cells interact only by way of the clock signal, without sharing e.g. a parity signal, minimizes the logic required in each cell, increasing its maximum operating frequency. It may be estimated that, for equal technology, the gain in maximum frequency with respect to a conventional architecture (e.g. FIGS. 1A and 1B) is of the order of 1.5.

FIG. 3B illustrates the logic diagram of a logic cell $CL_i$ of the counter of FIG. 3A other than the last cell, $CL_{N-1}$.

This cell comprises two circuits:

a clock generating circuit CGH, which takes the clock signal $CK_i$ of the input port PEH, generates the clock signal $CK_{i+1}$ and renders it available on the output port PSH; and a circuit for generating a Gray count bit CGBG which takes the clock signal $CK_i$ of the input port PEH, generates the Gray count bit $bg_i$ and, optionally, the natural binary count bit $bn_i$.

The clock generating circuit CGH comprises in its turn:

a clock switch CG connected between the input port PEH and the output port PSH so as to authorize or prohibit the passage of a clock pulse; and an authorization signal generating circuit CAU which generates a signal for driving the switch, or "authorization" signal, referenced by $enb_i$ in the figure.

The authorization signal $enb_i$ takes a first binary value (for example zero) on startup of the circuit, and then changes binary value at each clock pulse present at the input PEH. This can be achieved with the aid of a very simple circuit CAU, consisting for example of a flip-flop $B_{AU}$ having a clock input $EH_{AU}$ linked to the input port PEH, a data input $ED_{AU}$ and a data output $PS_{AU}$ looped back to the input by way of an inverter ("NOT" logic gate). The signal $enb_i$ is tapped off from the data output.

The switch CG authorizes or prohibits the passage of a clock pulse present at its input as a function of the value of the authorization signal $enb_i$; more precisely, it prohibits the passage of the clock pulse when $enb_i$ exhibits the said first binary value (0) and authorizes it when $enb_i$ exhibits a second binary value opposite to the first (1). Advantageously, the switch is a clock gater, see for example the article by J. Kathuria et al. "A Review of Clock Gating Techniques", MIT International Journal of Electronics and Communication Engineering, Vol. 1, No. 2, pages 106-114 (2011).

The circuit for generating a Gray count bit CGBC, comprises a flip-flop $B_{BG}$ having a clock input $EH_{BG}$ linked to the input port PEH, a data input $ED_{BG}$ and a data output $PS_{BG}$ looped back to the input by way of a multiplexer MX and an inverter ("NOT" logic gate). The Gray count bit $bg_i$ is tapped off from the data output $PS_{BG}$.

The multiplexer MX is driven in such a way that the output of the flip-flop is looped back to its input without inversion when the switch authorizes the passage of a clock signal (and therefore $enb_i$ takes its second binary value, "1" in the example considered) and with inversion when the switch prohibits the passage of a clock signal (and therefore $enb_i$ takes its first binary value, "0" in the example considered). In principle, the multiplexer MX could be driven directly by the signal $enb_i$; however, for reasons which will be clarified hereinafter it is preferable for it to be driven by a control signal SC generated in an independent manner by a flip-flop $B_{SC}$ having a clock input $EH_{SC}$ linked to the input port PEH, a data input $ED_{SC}$ and a data output $PS_{SC}$ looped back to the input by way of an inverter ("NOT" logic gate). In practice this is a replica of the authorization circuit CAU.

The reason why it is preferable to duplicate the authorization circuit is as follows. The clock switch CG introduces a delay, and therefore a different latency at the input of each cell. If precautions were not taken, the Gray count bits would not be updated at the same time and the counter would pass through incorrect intermediate states in which the first M count bits (M<N) have been updated, but not the last (N−M). In the limit, for N sufficiently high, the propagating time for a clock pulse to traverse the counter would become greater than the period of $CK_0$, and the counter would cease to operate correctly. Thus, the maximum operating frequency of the counter would be a decreasing function of N, as in the case of the prior art.

Figure 2:
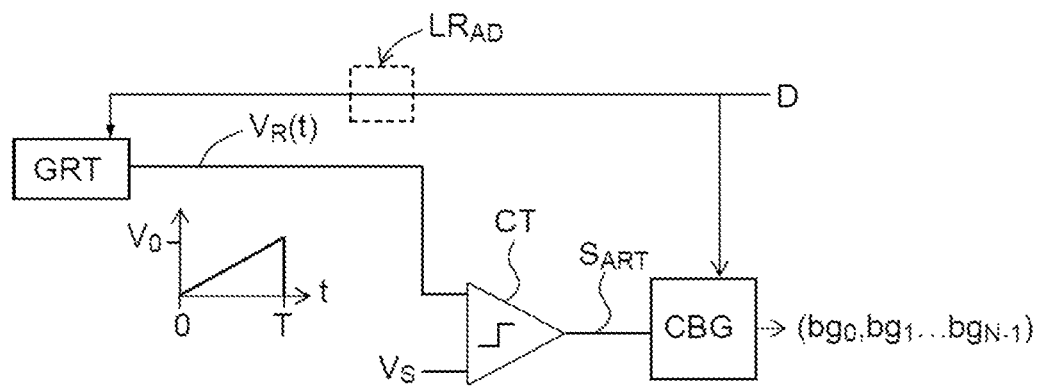
FIG. 2, also described above, an analogue-digital converter of the ramp type, comprising a Gray counter according to the prior art or according to the invention.

To avoid this, it is proposed to introduce a delay line $LR_i$—for example consisting of an even number of inverters linked in cascade—between the clock input port PEH of the cell $CL_i$ and its circuit for generating a Gray count bit, CGBC; the latter circuit thus receives a delayed clock signal at an input port PHR. The delay introduced by the line $LR_i$ is ideally equal to the aggregate delay introduced by the clock switches of all the cells downstream of the cell $CL_i$ (that is to say the cells $CL_{i+1}$ to $CL_{N-1}$). Thus, all the count bits switch at the same time, with a delay ("latency"), with respect to the arrival of the first clock pulse at the input PEH of the cell $CL_0$, dependent on N. It is very important to underline that the presence of the delay lines renders the operating frequency of the counter entirely independent of the number of count bits, N. Only the latency is an increasing function of N, but this is much less of a hindrance. If, for example, it is desired to use a counter according to the invention and exhibiting a high number of bits, in the analogue-digital converter of FIG. 2, it will suffice to provide a delay line on the triggering signal branch D directed towards the ramp generator GRT so as to compensate for the counter's latency (represented dashed in FIG. 2, reference $LR_{AD}$). As a variant, it is possible not to compensate for this latency, or to compensate for it in an incomplete manner, thereby entailing an offset of the output of the converter with respect to its expected value, and then to correct this offset digitally.

As a variant, it is possible not to duplicate the authorization circuit, and therefore to make a saving in regard to the flip-flop $B_{SC}$ and to the inverter associated therewith. In this case, however, the compensation for the delay can only be partial, since the flip-flop $B_{AU}$ must be balanced with the switch CG, while $B_{SC}$ must be balanced with the output; these two conditions cannot be satisfied simultaneously by one and the same flip-flop. This solution is therefore appropriate only for not overly high values of N.

As a variant, compensation could be achieved without duplicating the authorization circuit, by driving the multiplexer MX by a version of $enb_i$ delayed by a suitably dimensioned delay line. Such a solution may turn out to consume a greater area of silicon than the duplication of the authorization circuit, while being less reliable since its operation rests upon the balance between two delay lines.

Finally, the question of the compensation of the delay—and of the duplication of the authorization circuit—can be ignored if N is sufficiently small with respect to the operating frequency.

By way of example an embodiment of the counter according to the invention is considered in the form of an integrated circuit in 180-nm CMOS electronic technology, with a clock frequency equal to 700 MHz (clock period: 1.428 ns). Each clock switch is embodied as an AND gate having the signals $CK_i$ and $enb_i$ at its inputs and introduces a delay of 200 ps. Under these conditions, for N=15, the latency is 6 ns. Without delay compensation, the counter could not operate since the cell $CL_0$ would receive four clock pulses at its input before the first clock pulse reaches the last cell. On the other hand, a latency of 6 ns is generally acceptable. In the case of a count with 4 or 5 bits, it would be possible to dispense with delay compensation.

The control signal SC (or $enb_i$, if there is no duplication of the authorization circuit) can be provided to the output port PSB of the cell $CL_i$, if said port is present. It is possible to demonstrate that it constitutes a natural binary count bit, $bn_i$. Dual counting, in terms of Gray code and natural binary code, is thus achieved without additional cost (except the addition of an output per cell). Of course, counting in natural binary code exhibits the aforementioned drawback, related to the changing of several bits during an increment.

Figure 3C:
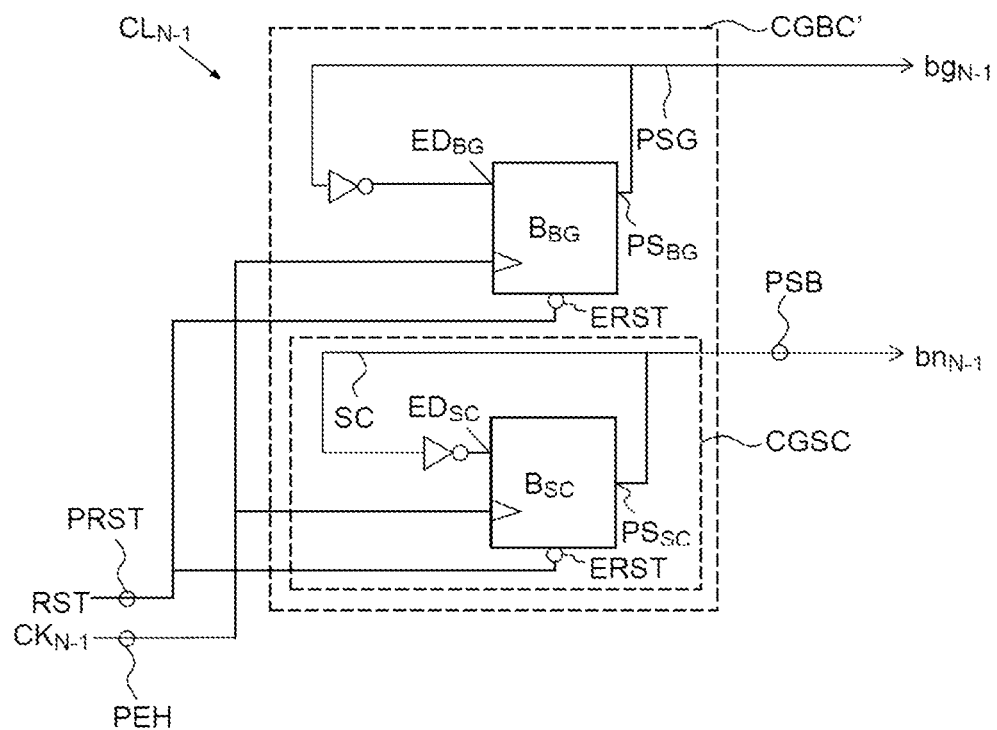

The last logic cell of the counter $CL_{N-1}$, is different from the others, and its diagram is given in FIG. 3C. As it is the last cell to receive a clock pulse, it does not need a delay line; furthermore, as it does not have to provide a clock signal to any logic cell downstream, it need not comprise any clock generating circuit. Furthermore, its circuit for generating a Gray count bit, CGBC', does not comprise any multiplexer: the output $PS_{BG}$ of the flip-flop $B_{BG}$ is simply looped back to its input $ED_{BG}$ by way of an inverter.

The reinitialization signal RST is provided to a reinitialization input ERST of all the flip-flops of each logic cell.

FIG. 4 illustrates the operation of the counter of FIGS. 3A, 3B and 3C, considering N=3. This is a timechart showing the waveforms of the signals $CK_0$, $enb_0$ (or $bn_0$), $bg_0$, $CK_1$, $enb_1$ (or $bn_1$), $bg_1$, $CK_2$, $enb_2$ (or $bn_2$) and $bg_2$, as well as the words formed by the Gray count bits (Gray=$bg_0$ $bg_1$ $bg_2$) and natural count bits (BN=$bn_0$ $bn_1$ $bn_2$). The delays introduced by the clock switches are assumed negligible for the sake of simplicity.

The counter architecture proposed lends itself particularly to an integrated embodiment, even though an embodiment with discrete components is also possible.

The invention has been described with reference to a particular embodiment, but variants are possible. For example, the person skilled in the art is able to envisage different embodiments of the circuits for generating the clock signals and of the circuit for generating the Gray count bits exhibiting the required functionalities.

The invention claimed is:

1. An N-bit Gray counter, with N being an integer greater than 1, comprising:
   a string of N logic cells connected in cascade, wherein each said logic cell comprises an input port at which a succession of clock pulses arrive and a generating circuit for generating a Gray count bit, said generating circuit having an output port for the Gray count bit,
   wherein each said logic cell, except at most a last logic cell of the string, comprises a circuit for generating a clock signal having a clock output port linked to the input port of a following logic cell in the string, and
   wherein:
      each said circuit for generating the clock signal is configured to allow a passage of every other clock pulse in the succession of clock pulses arriving at the input port of said each logic cell, to the clock output port;
      the generating circuit for generating the Gray count bit for each said logic cell is configured to invert a value of the Gray count bit present at the output port each time that the circuit for generating the clock signal of a corresponding logic cell prohibits the passage of a clock pulse in the succession of clock pulses and is configured to not invert the value of the Gray count bit when the clock pulse is allowed to pass to the clock output port; and
      the generating circuit for generating the Gray count bit for the last logic cell of the string is configured to invert the value of the Gray count bit present at the output port each time that the clock pulse is present at the input port of the last logic cell.

2. The Gray counter according to claim 1, wherein the circuit for generating the Gray count bit for each said logic cell, except at most the last logic cell, of the string, also comprises a clock signal input linked to the input port of the corresponding logic cell by a delay line configured to introducing a delay which decreases according to an order of the logic cell in the string.

3. The Gray counter according to claim 1, wherein each said circuit for generating the clock signal comprises:
   a switch configured to authorize or otherwise allow the clock pulses from the input port to the clock output port, and
   an authorization circuit configured to generate a drive signal for the switch authorizing the every other clock pulse.

4. The Gray counter according to claim 3, wherein the authorization circuit comprises a flip-flop having a data input port, a clock input port linked to the clock input port of the logic cell and an output port, the data input port being connected to receive a complement of a bit present on the output port.

5. The Gray counter according to claim 4, wherein said flip-flop of said each logic cell comprises a reinitialization input, all the reinitialization inputs being linked together to receive a common reinitialization signal.

6. The Gray counter according to claim 1, wherein the generating circuit for generating the Gray count bit for said each logic cell, with the exception of the last logic cell of the string, comprises:
   a multiplexer with two inputs and an output, and connected to receive on a first input, the Gray count bit of a corresponding logic cell and on a second input a complement of the Gray count bit, and configured to transfer to the output of the multiplexer, the Gray count bit present on the first input when the circuit for generating the clock signal of the corresponding logic cell is configured to allow a clock pulse in the every other clock pulse, and to transfer the complement of the Gray count bit present on the second input when a clock pulse is not allowed; and a flip-flop having a data input port, a clock input port linked to the input port of the logic cell and an output port linked to the output port for the Gray count bit for the cell, the data input port being linked to the output of the multiplexer.

7. The Gray counter according to claim 6, wherein the circuit for generating a Gray count bit for said each logic cell, except the last logic cell, of the string, further comprises a circuit for generating a control signal for the multiplexer comprising a flip-flop of the multiplexer having a data input port, a clock input port linked to the input port of the logic cell and an output port, the data input port being connected so as to receive a complement of the Gray count bit present on the output port and the output port being connected to a control input of the multiplexer.

8. The Gray counter according to claim 7, wherein the circuit for generating the Gray count bit for said each logic cell further comprises an output port for natural binary counting, linked to the output port of the circuit for generating the control signal for the multiplexer.

9. The Gray counter according to claim 6, wherein the generating circuit for generating the Gray count bit for the last logic cell of the string comprises a flip-flop having a data input port, a clock input port linked to the input port of the logic cell and an output port linked to the output port for the Gray count bit for the cell, the data input port being linked to receive the complement of the Gray count bit present on the output port.

10. The Gray counter according to claim 9, wherein said flip-flop of each logic cell comprises a reinitialization input, all the reinitialization inputs being linked together to receive a common reinitialization signal.

11. The Gray counter according to claim 6, wherein said flip-flop of each logic cell comprises a reinitialization input, all the reinitialization inputs being linked together to receive a common reinitialization signal.

12. A ramp type analogue-digital converter comprising:
a generator of a voltage ramp;
a voltage comparator connected to the generator of the voltage ramp to receive at a first input the voltage ramp and at a second input an analogue voltage signal to be converted, said voltage comparator configured to generate a stopping signal when a voltage level at the first input exceeds that at the second input; and
a binary counter configured to start a count at a commencement of a generation of the voltage ramp and stop the count upon a generation of the stopping signal,
wherein said binary counter is an N-bit Gray counter, with N being an integer greater than 1, said N-bit Gray counter including:
a string of N logic cells connected in cascade, wherein each said logic cell comprises an input port at which a succession of clock pulses arrive and a generating circuit for generating a Gray count bit, said generating circuit having an output port for the Gray count bit,
wherein each said logic cell, except at most a last logic cell of the string, comprises a circuit for generating a clock signal having a clock output port linked to the input port of a following logic cell in the string, and wherein:
each said circuit for generating the clock signal is configured to allow a passage of every other clock pulse in the succession of clock pulses arriving at the input port of said each logic cell, to the clock output port;
the generating circuit for generating the Gray count bit for each said logic cell is configured to invert a value of the Gray count bit present at the output port each time that the circuit for generating the clock signal of a corresponding logic cell prohibits the passage of a clock pulse in the succession of clock pulses and is configured to not invert the value of the Gray count bit when the clock pulse is allowed to pass to the clock output port; and
the generating circuit for generating the Gray count bit for the last logic cell of the string is configured to invert the value of the Gray count bit present at the output port each time that the clock pulse is present at the input port of the last logic cell.

* * * * *